(12) United States Patent
Pasotti et al.

(10) Patent No.: US 6,259,626 B1
(45) Date of Patent: Jul. 10, 2001

(54) METHOD FOR STORING BYTES IN MULTI-LEVEL NON-VOLATILE MEMORY CELLS

(75) Inventors: Marco Pasotti, S. Martino Siccomario; Giovanni Guaitini, Trecella; Pier Luigi Rolandi, Monleale, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/616,507

(22) Filed: Jul. 14, 2000

(30) Foreign Application Priority Data

Jul. 22, 1999 (IT) .............................. MI99A01616

(51) Int. Cl.[7] .................................. G11C 16/04
(52) U.S. Cl. .............................. 365/185.19; 368/185.03; 368/185.33; 368/221
(58) Field of Search ........................ 365/185.19, 185.03, 365/185.33, 221, 189.07, 189.04, 189.12

(56) References Cited

U.S. PATENT DOCUMENTS 5,515,321 * 5/1996 Hazama .......................... 365/185.19

* cited by examiner

*Primary Examiner*—David Nelms
*Assistant Examiner*—David Lam
(74) *Attorney, Agent, or Firm*—Wolf, Greenfield & Sacks, P.C.; James H. Morris; Theodore E. Galanthay

(57) ABSTRACT

A method for storing n bytes in multi-level non-volatile memory cells, including writing and reading of said n bytes. Writing includes the following steps: (a) decomposing each one of such n bytes into eight bits, (b) storing each one of such eight bits into a respective one of such multi-level non-volatile memory cells by utilizing a multi-level technology. Reading includes the following steps: (c) reading contemporaneously each one of such eight bits which belong to each one of said n bytes by sense amplifiers each connected to each one of such multi-level non-volatile memory cells, (d) assembling such eight bits previously read to form each one of such initial n bytes.

6 Claims, 3 Drawing Sheets

METHOD FOR STORING BYTES IN MULTI-LEVEL NON-VOLATILE MEMORY CELLS

BACKGROUND OF THE INVENTION

1. Field of the Invention

The present invention relates to a method for storing bytes in multi-level nonvolatile memory cells and particularly in Flash memory cells.

2. Discussion of the Related Art

The need to have non-volatile memory devices with a higher and higher memory capacity requires semiconductor makers to continuously reduce the dimensions of the memory devices and to increase the density of stored data.

A typical method utilized for increasing the density of the data stored in a Flash memory, without necessarily reducing the dimensions of the single memory cells, consists in programming and reading the same cells by a multi-level technology. Such technology consists in storing more than one bit in each single cell, this is the cell must show $m=2^n$ different programming states or analog levels, wherein n represents the number of bits which can be stored in the memory cells, and each level is in correspondence with a different value of the threshold voltage of the transistor constituting the cell.

With respect to binary Flash memory cells, for discriminating the m different programming levels a higher precision in programming and reading is required, thus making these operations slower. However, because the increasing interest in the formation of the mass memory devices, which replace the magnetic disk with the Flash memories, has brought definition of some standards (for example MultiMediaCard, SmartMedia, MemoryStick, CompactFlash) which interface the host system with the same memory by relative speed specifications, it is necessary to speed all the basic operations in the Flash memory cells: writing, reading and programming.

In order to speed the writing and reading operations a fast sense amplifier is utilized which allows reducing the time in the check step. This last step consists in controlling continuously the achieved threshold voltage value, as ensuring that it is the value desired after having applied a certain pulse number to the same cell.

A recent technology provides to use a successive approximation sense amplifier to allow also the parallel reading of many multi-level memory cells. The threshold value is converted into a current, and by n comparison steps, where n is the bit number for a memory cell, the digital information is available at output. In reality, already after the first comparison the first of the bit n stored in the cell is available at output, and generally in the i-eth step the i-eth bit is available.

If a byte is stored into two multi-level Flash memory cells, for example in sixteen levels, different steps for writing the byte are necessary. In fact initially the first four bits of the byte must be assembled and transformed in the correspondent analog level and written in a multi-level Flash memory cell. Then it is necessary to assemble the second four bits of the byte, to transform them into the correspondent level and to write the level in another multi-level Flash cell. In order to read the byte, even by reading the two cells in parallel, at least four comparison cycles are necessary in order to have available the whole byte and this increases considerably the reading time.

In view of the state of the art described, it is an object of the present invention to provide a method to carry out, in a faster way, the storing of bytes in multi-level nonvolatile memory cells.

SUMMARY OF THE INVENTION

According to the present invention, this and other objects are achieved by a method for storing n bytes in multi-level non-volatile memory cells, comprising writing and reading of said n bytes, the writing comprising the following steps: (a) decomposing each one of said n bytes into eight bits, (b) storing each one of said eight bits into a respective one of said multi-level non-volatile memory cells by utilizing a multi-level technology, and the reading comprising the following steps: (c) reading simultaneously each one of said eight bits which belong to each one of said n bytes by sense amplifiers each connected to each one of said multilevel non-volatile memory cells, (d) assembling said eight bits previously read to form each one of said initial n bytes.

Thanks to the present invention it is possible to provide a method for storing bytes in multi-level non-volatile memory cells that is faster than the typical technology.

Such method allows to read a single byte after only one reading cycle even if it does not allow a higher media speed for reading bytes.

Moreover this method allows to write bytes faster because, for writing, for example, a single byte it is not necessary to program totally two multi-level cells, thus determining rather high average liftings of the threshold voltage of the multi-level cell, but the average liftings of the threshold voltage of the multi-level cell are more contained and also achievable in a smaller time.

BRIEF DESCRIPTION OF THE DRAWINGS

The features and the advantages of the present invention will be made evident by the following detailed description of an embodiment thereof, illustrated as not limiting example in the annexed drawings, wherein.

DETAILED DESCRIPTION

Figure 1:
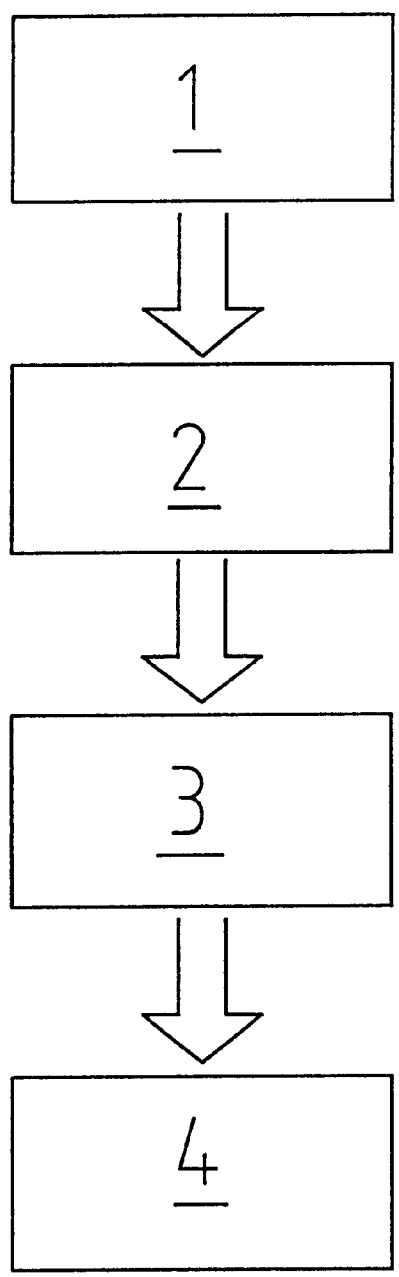
FIG. 1 shows a block diagram for a method according to the present invention.

In FIG. 1 the successive steps of implementation of the storing method according to invention are shown schematically, which comprises reading and writing steps. Reading utilizes the steps 1 and 2, where in 1 the bytes are decomposed into n bits and in 2 the bits are stored each one thereof into respective multi-level memory cells. Reading regards the blocks 3 and 4, where in 3 the bits belonging to each byte are read by successive approximation sense amplifiers each one connected to a respective multi-level Flash memory cell, and in 4 the byte is recomposed by the bits read in 3.

Figure 2:
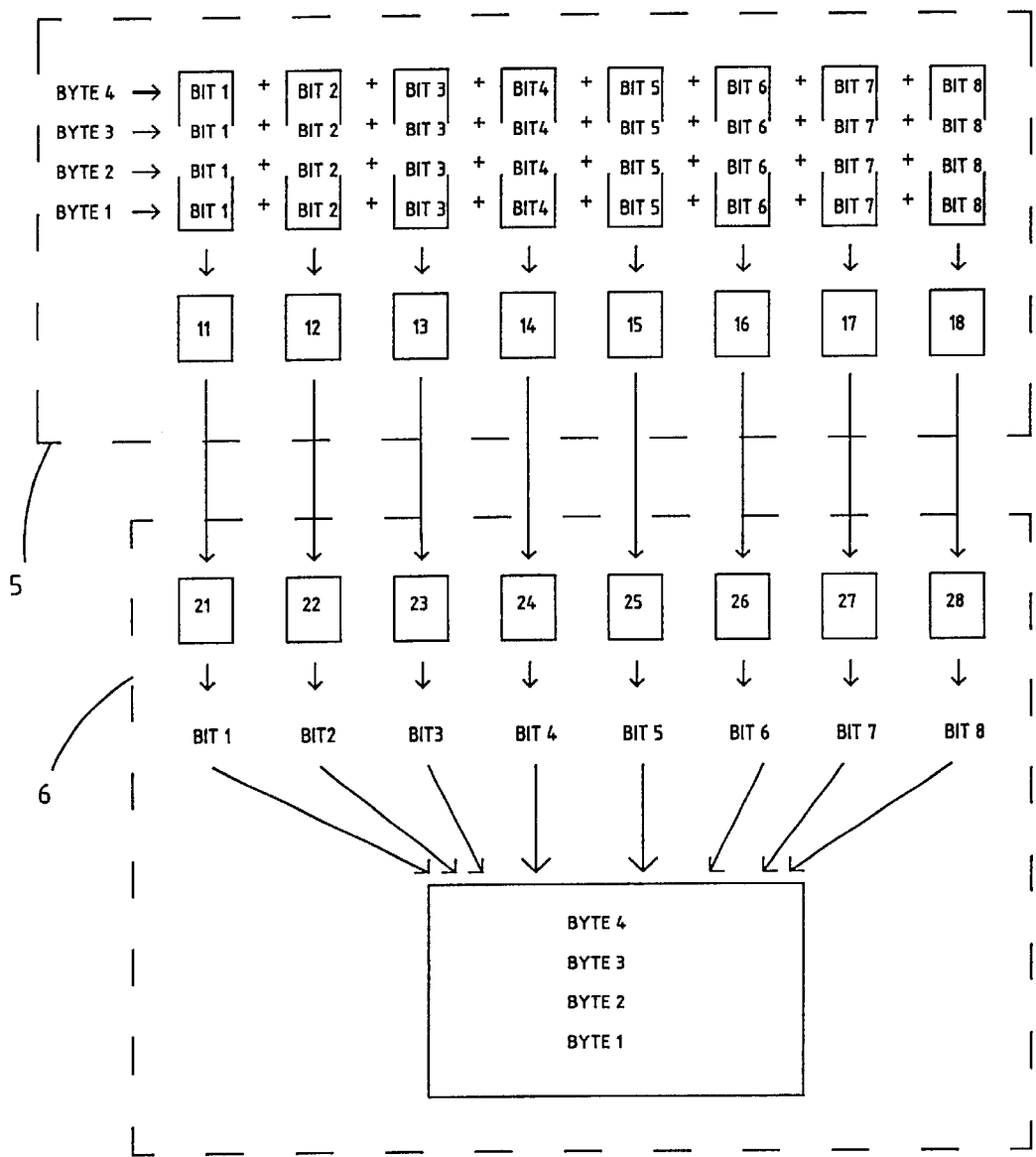
FIG. 2 shows a block diagram which is similar to that of FIG. 1 but it is more detailed.

A more detailed description of the following steps of the above mentioned storing method are shown in FIG. 2, where, inside the hatched block 5, which regards the writing, each one of the bytes byte1–byte4 is decomposed into eight bits bit1–bit8. The bits bit1–bit8 are stored in respective multi-level Flash memory cells 11–18 by following the rules of a multi-level technology, that is by annexing to each group of the bits bit1–bit8 the correspondent analog level in the respective memory cell. If, for example, the multi-level memory cells 11-18 have been programmed to assume one among sixteen analog levels, which correspond to prefixed threshold voltages of the multi-level cell, and groups formed by four bits (from less significant bit group 0000 to more significant bit group 1111) correspond in a crescent manner to the sixteen analog levels (from the zero to fifteen), it is obtained that the analog level will be higher or equal to the precedent when each bit arrives into cell and the cells can be programmed little by little when the bits are available. If, for example, the group of the bit1s is composed by bits 1010 belonging each one to the respective bytes byte1–byte4, it can be written into multi-level cell 11 in a first or a second manner which are different between them according to whether the bit bit1 belonging to byte byte1 is considered as the less significant or more significant bit. In the first manner the analog level which must be associated to the bit1s arriving will be the analog level 1 for the bit11, in turn, when the bit1 0 arrives the analog level does not change, when the bit1 1 arrives there is the analog level 5 (associated to the group 0101), when the bit1 0 arrives the analog level does not change. That above described for the memory cell 11 occurs simultaneously for the other memory cells 12–18.

Inside the hatched block 6, which regards the reading, the connection of each Flash memory cell 11–18 with respective successive approximation sense amplifier 21–28 is obtained. The successive approximation sense amplifiers are of the type shown in simple manner in FIG. 3, where a constant voltage Vrow, which is generally higher than the highest one among the possible threshold voltages of a generic multi-level Flash cell FL, is applied at the gate terminal of the same cell FL. Consequently a current Flash is obtained which depends on the actual threshold voltage value of the cell FL, in fact the value that the current assumes is reduced when the threshold voltage value increases, that is it is lower if the threshold voltage is high. A MOS transistor M2 and an inverter 7 maintain the drain of the cell at a constant voltage and low enough to avoid drain stresses in the memory cell that could to bring to a programming which is not desired thereof. Symmetricly an inverter 8 and a transistor M1 respectively equal to the inverter 7 and transistor M2 are placed on the line 9 of the sense amplifier. It is imposed an operation of the Flash cell FL at a linear zone so that the relation between the drain current of the cell and threshold voltage thereof is substantially linear. If, for example, the analog level 0, which corresponds to a drain current Iflash equal to Imax, is associated to the level where the cell FL is virgin, and the value of current Iflash which is equal to Imax/16 is associated to the level 15, generally the value of the current Iflash will be done by:

$$Iflash = Imax * (1 - B3/2 - B2/4 - B1/8 - B0/16)$$

where B3–B0 are the bits stored in the cell FL which must be read. The current Iflash change from the level 0 to level 15 at pitches of Imax/16.

A reference current Iref is generated by a digital/analog converter DAC. The four bits in input to the DAC, B0_N-B3_N, are the outputs of a successive approximation register SAR. These bits, at the end of the reading, will constitute each one respectively the negation of each one of the four bits stored in the Flash cell FL. The current Iref is for example connected to the bits B0_N-B3_N by this relation:

$$Iref = Imax * (1/32 + B3\_N/2 + B2\_N/4 + B1\_N/8 + B0\_N/16).$$

At the end of the reading the difference between Iflash and Iref is:

$$Iflash - Iref = -(Iflash - Iref) = -Imax/32 \text{ that is a value smaller than zero.}$$

A comparator 10 compares the nodes VP and VM and its output goes at input to the SAR. The whole circuit is activated by the application of suitable control signals, which are not shown in figure, which are generated by dedicated logic circuits and a dedicated microcontroller.

Figure 3:
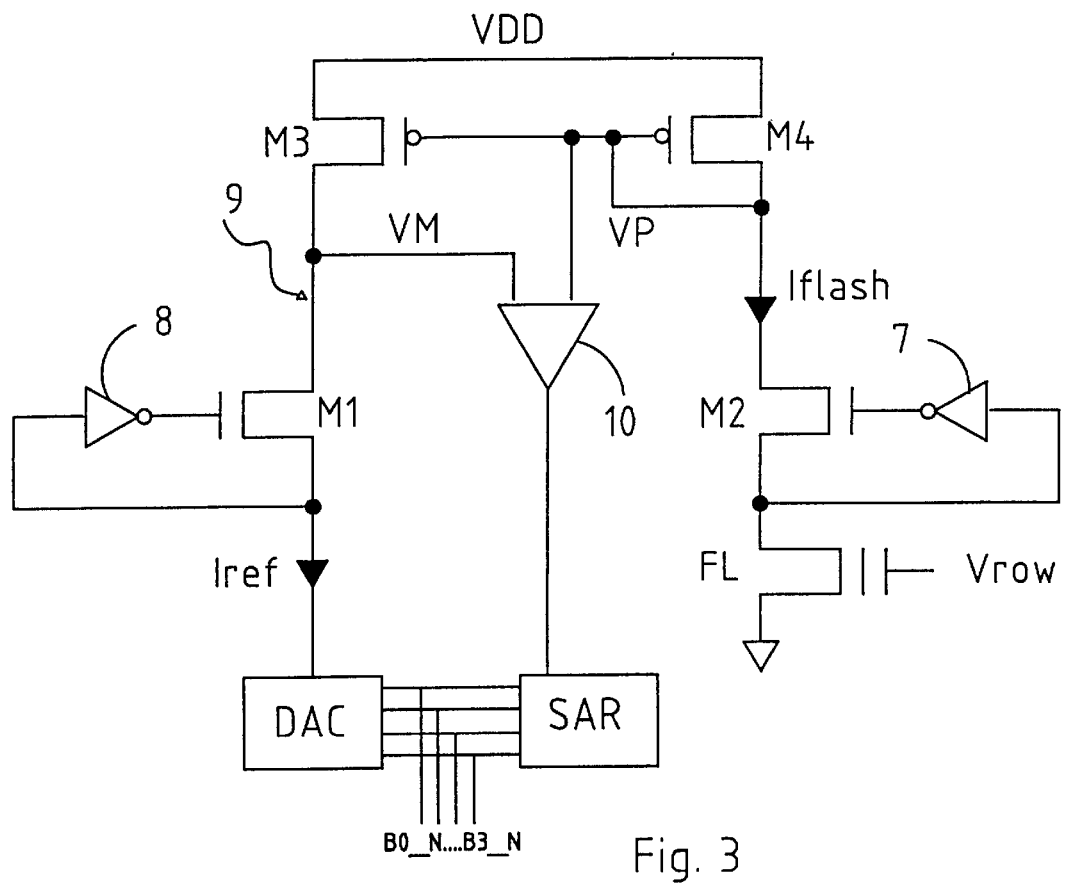
FIG. 3 shows a circuit diagram of a successive approximation sense amplifier.

The sense amplifier of FIG. 3 operates in the following manner.

The current Iflash is mirrored from the mirror made by two transistors M3 and M4 which are connected to a supply voltage VDD on the line 9. The current Iref is subtracted to the current Iflash, so that the voltage on the node VM will be lowered or lifted if respectively Iref is higher than Iflash or Iref is lower than Iflash and consequently the output of the comparator 10 will be high or low. The reading of the cell is in four steps. Initially all the bits in output to the SAR and in input to the DAC are set equals to zero less the more significant bit B3_N. The current Iref will be equal to Imax*(1/32+1/2) and then a comparison with the current Iflash is performed. If Iref is higher than Iflash thus the bit B3 of the cell FL is high and this causes a high output of the comparator 10 and also the SAR puts B3_N to the low level. If instead Iref is lower than Iflash the output of the comparator 10 is low and also the SAR lied high the value of B3_N. The bit B3_N at the next step remains to the determined value while the bit B2_N is set equal to one and the other bits remain to the value zero. The value of Iref will be equal to Imax*(1/32+B3_N+1/4) and it is proceeded in the aforementioned manner to obtain the value of B2_N. Then the aforementioned process steps are iterated for the bits B1_N and B0_N. At the end of the last step, as it has been anticipated, the bits B0_N–B3_N will have assumed each one a value equal to the negation of each one of the bit B0–B3 stored in the Flash cell FL, and NOT gates connected to the SAR outputs need be utilized to obtain precisely the data written in the cell FL.

Figure 4:
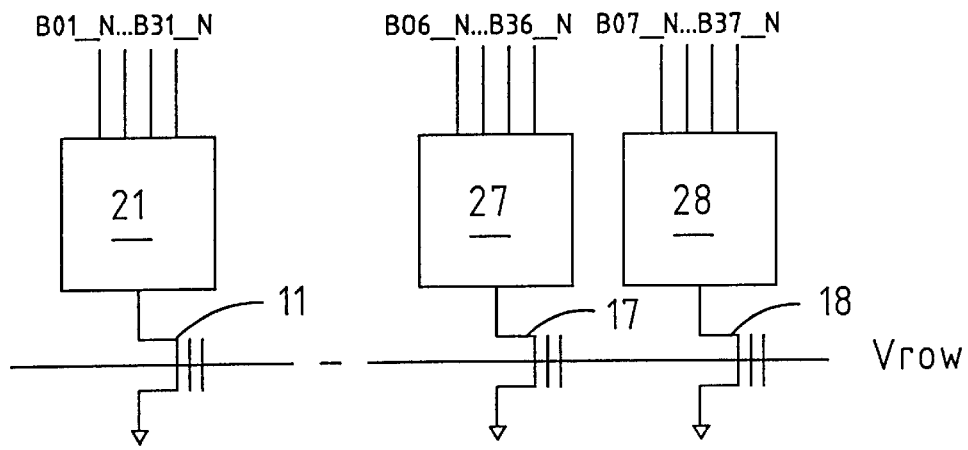
FIG. 4 shows a particular of FIG. 2 with multi-level cells annexed to respective successive approximation sense amplifiers.

In FIG. 4 are shown the successive approximation sense amplifiers 21–28, which are connected to the respective memory cells 11–18, and which have the following respective bits in output of the appropriate SAR: B01_N–B31_N, . . . B07_N–B37_N. After the first step of reading which is contemporaneous for each memory cell, each one of the sense amplifiers 21–28 will done in output one bit and assembling the eight bits obtained by each sense amplifier, the byte4, previously written, is obtained, as shown in FIG. 2, if the first manner of writing of the bits of the aforementioned multi-level technology has been utilized or the byte1 is obtained if the second manner has been utilized. As going on the successive reading steps relating to each sense amplifier for each Flash memory cell the bytes byte3–byte1 in the first case and the bytes byte2–byte4 in the second case are obtained sequentially respectively. The data access mechanism is thus of the LIFO (Last In Last Output) type in the first case and of the FIFO (First Input First Output) type in the second case. Also, if only the byte1 is written, by the data access mechanism of the FIFO type only one reading cycle for each sense amplifier is necessary to obtain the whole byte at output.

Having thus described at least one illustrative embodiment of the invention, various alterations, modifications, and improvements will readily occur to those skilled in the art. Such alterations, modifications, and improvements are intended to be within the spirit and scope of the invention.

Accordingly, the foregoing description is by way of example only and is not intended as limiting. The invention is limited only as defined in the following claims and the equivalents thereto.

What is claimed is:

1. A method for storing n bytes in multi-level non-volatile memory cells, comprising writing and reading of said n bytes, the writing comprising the following steps: (a) decomposing each one of said n bytes into eight bits, (b) storing each one of said eight bits into a respective one of said multi-level non-volatile memory cells by utilizing a multi-level technology, and the reading comprising the following steps: (c) reading simultaneously each one of said eight bits which belong to each one of said n bytes by sense amplifiers each connected to each one of said multilevel non-volatile memory cells, (d) assembling said eight bits previously read to form each one of said initial n bytes.

2. A method according to claim 1, wherein said sense amplifiers are successive approximation sense amplifiers.

3. A method according to claim 2, wherein said n bytes are written and read by a LIFO sequence.

4. A method according to claim 2, wherein said n bytes are written and read by a FIFO sequence.

5. A method according to claim 4, wherein said n bytes are a single byte which is read by said successive approximation sense amplifiers by a single reading cycle for each one of them.

6. A method according to claim 1, wherein said multi-level non-volatile memory cells are multi-level Flash memory cells.

* * * * *